United States Patent [19]

Murata et al.

[11] Patent Number: 5,482,816

[45] Date of Patent: * Jan. 9, 1996

[54] RADIATION-SENSITIVE COMPOSITION

[75] Inventors: Makoto Murata; Mikio Yamachika; Yoshiji Yumoto; Takao Miura, all of Yokkaichi, Japan

[73] Assignee: Japan Synthetic Rubber Co., Ltd., Tokyo, Japan

[*] Notice: The portion of the term of this patent subsequent to Jul. 26, 2011, has been disclaimed.

[21] Appl. No.: 263,421

[22] Filed: Jun. 21, 1994

Related U.S. Application Data

[62] Division of Ser. No. 941,264, Sep. 4, 1992, Pat. No. 5,332,650.

[30] Foreign Application Priority Data

Sep. 6, 1991 [JP] Japan .................... 3-254225

[51] Int. Cl.$^6$ ............. G03F 7/004; G03F 7/023; G03C 1/52
[52] U.S. Cl. ........... 430/270.14; 430/171; 430/176; 430/189; 430/191; 430/192; 430/193; 430/910; 430/920; 430/921; 522/31; 522/32; 522/36; 522/39; 522/63
[58] Field of Search .................... 430/270, 170, 430/171, 175, 176, 189, 191, 192, 193, 910, 920, 921; 522/31, 32, 36, 39, 63

[56] References Cited

U.S. PATENT DOCUMENTS

| | | | |
|---|---|---|---|
| 4,946,760 | 8/1990 | Elsaesser | 430/270 |
| 5,068,168 | 11/1991 | Lee | 430/270 |
| 5,332,650 | 7/1994 | Murata et al. | 430/270 |
| 5,346,803 | 9/1994 | Crivello et al. | 430/270 |

Primary Examiner—John S. Y. Chu
Attorney, Agent, or Firm—Oblon, Spivak, McClelland, Maier & Neustadt

[57] ABSTRACT

A radiation-sensitive composition comprising (A) a polymer having a recurring unit represented by formula (1):

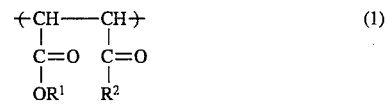

wherein $R^1$ represents a substituted methyl group, a substituted ethyl group, a silyl group, a germyl group or an alkoxycarbonyl group, and $R^2$ represents $-OR^3$ or $-NR^4R^5$ in which $R^3$ is a hydrogen atom, a straight-chain alkyl group, a cyclic alkyl group, an aryl group, an aralkyl group, a substituted methyl group, a substituted ethyl group, a silyl group, a germyl group or an alkoxycarbonyl group, and $R^4$ and $R^5$, which may be the same or different, are hydrogen atoms, straight-chain alkyl groups, cyclic alkyl groups, aralkyl groups or aryl groups, and (B) a radiation-sensitive acid forming agent. Said radiation-sensitive composition can be suitably used as a resist composition which enables reliable fine processing, which has high sensitivity and high resolution degree, and which is superior in dry etching resistance, develop-ability, adhesiveness, heat resistance and yield of residual film thickness.

12 Claims, No Drawings

RADIATION-SENSITIVE COMPOSITION

This is a division, of application Ser. No. 07/941,264, filed on Sept. 4, 1992, now U.S. Pat. No. 5,332,650.

The present invention relates to a radiation-sensitive composition, particularly to a radiation-sensitive composition which is suitably used as a resist composition in superfine processing employing a radiation such as far-ultraviolet rays (e.g. excimer laser), X-rays (e.g. synchrotron radiation), charged particle beams (e.g. electron beam) or the like.

In the field of fine processing, representative of which is production of integrated circuit elements, the processing size in lithography is becoming much smaller in order to obtain a higher degree of integration. In recent years, there has been required a technique enabling fine processing of 0.5 µm or less reliably. In this connection, also in the resist used in fine processing, it is required to form a pattern of 0.5 µm or less with high precision. Formation of such a fine pattern with high precision, however, is extremely difficult by the conventional method employing a visible light (700–400 nm) or near-ultraviolet rays (400–300 nm). Hence, a lithography employing a radiation having a short wavelength (300 nm or less) is under investigation.

The short wavelength radiation referred to above includes far-ultraviolet rays, typical examples of which are bright line spectrum (254 nm) emitted from a mercury lamp and KrF excimer laser (248 run); X-rays; charged particle beams; and so forth. Of these, the excimer laser is drawing special attention, and special attention is also directed to lithography using the excimer laser. For this reason, with respect to the resist used in the lithography, a resist is also required which can form a fine pattern of 0.5 µm or less at a high sensitivity using an excimer laser and which has excellent developability (neither scums nor undeveloped portions remain during development), excellent adhesiveness (there is no stripping of resist pattern during development) and excellent heat resistance (there is no change of resist pattern by heat). Further, with respect to the resist used in the lithography, since the etching step is being changed to dry etching as integrated circuits are becoming finer, the dry etching resistance of resist has become an important requirement for obtaining good performance.

The present inventors have made extensive research in order to solve the above-mentioned problems of the prior art and found that a combination of a special polymer and a radiation-sensitive acid-forming agent can solve the above problems.

An object of the present invention is to provide a novel radiation-sensitive composition.

Another object of the present invention is to provide a radiation-sensitive composition which can be suitably used as a resist composition enabling reliable fine processing, having high sensitivity and high resolution degree, and being superior in dry etching resistance, developability, adhesiveness, heat resistance, etc.

Other objects and advantages of the present invention will become apparent from the following description.

According to the present invention, there is provided a radiation-sensitive composition comprising (A) a polymer having a recurring unit represented by formula (1):

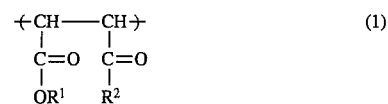

wherein $R^1$ represents a substituted methyl group, a substituted ethyl group, a silyl group, a germyl group or an alkoxycarbonyl group, and $R^2$ represents $—OR^3$ or $—NR^4R^5$ in which $R^3$ is a hydrogen atom, a straight-chain alkyl group, a cyclic alkyl group, an aralkyl group, an aryl group, a substituted methyl group, a substituted ethyl group, a silyl group, a germyl group or an alkoxycarbonyl group, and $R^4$ and $R^5$, which may be the same or different, are hydrogen atoms, straight-chain alkyl groups, cyclic alkyl groups, aralkyl groups or aryl groups, and (B) a radiation-sensitive acid-forming agent.

The polymer used as the component (A) in the present invention [said polymer is referred to hereinafter as polymer (A)] contains a recurring unit represented by formula (1).

Examples of the substituted methyl group in the definition of $R^1$ in formula (1) include a methoxymethyl group, a methylthiomethyl group, a methoxyethoxymethyl group, a tetrahydropyranyl group, a tetrahydrothiopyranyl group, a tetrahydrofuranyl group, a tetrahydrothiofuranyl group, a benzyloxymethyl group, a phenacyl group, a bromophenacyl group, a methoxyphenacyl group, an α-methylphenacyl group, a cyclopropylmethyl group, a cyclopentyl group, a cyclohexyl group, a benzyl group, a triphenylmethyl group, a diphenylmethyl group, a bromobenzyl group, a nitrobenzyl group, a methoxybenzyl group, a piperonyl group, a furfuryl group, etc.; examples of the substituted ethyl group include a 1-methoxyethyl group, a 1-ethoxyethyl group, an isopropyl group, a tert-butyl group, a 1,1-dimethylpropyl group, etc.; examples of the silyl group include a trimethylsilyl group, a triethylsilyl group, a tertbutyldimethylsilyl group, an isopropyldimethylsilyl group, a phenyldimethylsilyl group, etc.; examples of the germyl group include a trimethylgermyl group, a triethylgermyl group, a tert-butyldimethylgermyl group, an isopropyldimethylgermyl group, a phenyldimethylgermyl group, etc.; and examples of the alkoxycarbonyl group include a methoxycarbonyl group, an ethoxycarbonyl group, a tert-butoxycarbonyl group, etc.

Examples of the straight-chain alkyl group in the definition of $R^3$ in formula (1) include a methyl group, an ethyl group, an n-propyl group, an n-butyl group, etc. Examples of the cyclic alkyl group in the definition of $R^3$ include a cyclopentyl group, a cyclohexyl group, etc. Examples of the aralkyl group in the definition of $R^3$ include a benzyl group, an α-methylbenzyl group, a diphenylmethyl group, a trityl group, etc. Examples of the aryl group in the definition of $R^3$ include a phenyl group, a naphthyl group, a tolyl group, etc. Examples of the substituted methyl group, the substituted ethyl group, the silyl group, the germyl group and the alkoxycarbonyl group each in the definition of $R^3$ include the respective examples of the substituted methyl group, the substituted ethyl group, the silyl group, the germyl group and the alkoxycarbonyl group each mentioned in the definition of $R^1$.

Examples of the straight-chain alkyl group, the cyclic alkyl group, the aralkyl group and the aryl group each in the definitions of $R^4$ and $R^5$ include the respective examples of the straight-chain alkyl group, the cyclic alkyl group, the aralkyl group and the aryl group each mentioned in the definition of $R^3$.

In the present invention, the polymer (A) may consist only of a recurring unit represented by formula (1), or may consist of said recurring unit and other recurring units. Said other recurring units are preferably those represented by formulas (2), (3) and (4):

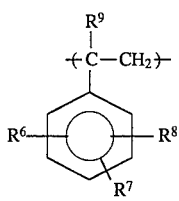

wherein $R^6$, $R^7$ and $R^8$, which may be the same or different, represent hydrogen atoms, halogen atoms, hydroxyl groups, amino groups, alkyl groups, preferably alkyl groups having 1–4 carbon atoms, or alkoxy groups, preferably alkoxy groups having 1–4 carbon atoms, and $R^9$ represents a hydrogen atom or a methyl group;

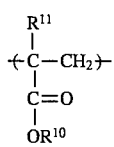

wherein $R^{10}$ represents a hydrogen atom or an alkyl group, preferably an alkyl group having 1–4 carbon atoms, and $R^{11}$ represents a hydrogen atom or a methyl group;

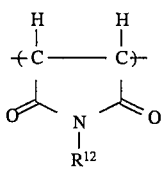

wherein $R^{12}$ represents a hydrogen atom, a methyl group, a phenyl group or a hydroxyphenyl group; and a recurring unit formed by cleavage of the double bond of maleic anhydride, maleic acid, fumaric acid, fumaronitrile, acrylamide, acrylonitrile, vinylpyridine, vinylpyrrolidone, vinylimidazole or vinylaniline. Of the above-mentioned other recurring units, particularly preferable are recurring units formed by cleavage of the double bond of styrene and maleic anhydride.

In the polymer (A) of the present invention, the proportion of the recurring unit represented by formula (1) cannot be uniquely defined because it can be varied depending upon the kind of said other recurring unit used; however, it is preferably 20% or more, more preferably 25% or more, particularly preferably 30% or more, based on the total recurring unit number. When the proportion is less than 20%, no sufficient effect is obtained for resist pattern formation.

The polymer (A) of the present invention has preferably a polystyrene-reduced weight average molecular weight (referred to hereinafter as Mw) of 1,000–50,000, particularly preferably 1,500–20,000.

The polymer containing a recurring unit represented by formula (1) used in the present invention can be produced, for example, by hydrolyzing the maleic anhydride portion of a poly(styrene-maleic anhydride) or a polymaleic anhydride to convert the portion to a dicarboxylic acid and then bonding, to a part or the whole of the carboxylic acid portion, a substituted methyl group, a substituted ethyl group, a silyl group, a germyl group or an alkoxycarbonyl group, or by converting the maleic anhydride portion of the above polymer to a half ester or a half amide using a hydroxy compound or an amine and then bonding, to the carboxylic acid portion of the resulting material, a substituted methyl group, a substituted ethyl group, a silyl group, a germyl group or an alkoxycarbonyl group.

The polymer (A) of the present invention may be used in admixture with other polymers. Examples of said other polymers are preferably polymers having a recurring unit formed by cleavage of the double bond of a double bond-containing compound such as hydroxystyrene, isopropenylphenol, acrylic acid, methacrylic acid, fumaric acid, maleic acid or the like.

The radiation-sensitive acid-forming agent which is the component (B), is a compound which generates an acid upon irradiation with a radiation. Said compound includes an onium salt, a halogen-containing compound, a diazoketone compound, a sulfone compound, a sulfonic acid compound, a nitrobenzyl compound, etc. Specific examples thereof are shown below.

Onium salts: Iodonium salts, sulfonium salts, phosphonium salts, diazonium salts, ammonium salts, etc., preferably, compounds represented by the following formulas:

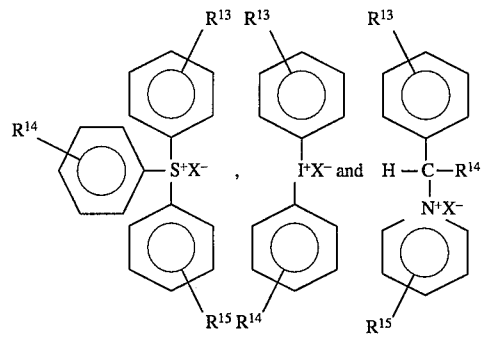

wherein $R^{13}$ to $R^{15}$, which may be the same or different, represent hydrogen atoms, amino groups, nitro groups, cyano groups, alkyl groups, preferably alkyl groups having 1–4 carbon atoms or alkoxy groups, preferably alkoxy groups having 1–4 carbon atoms, and X represents

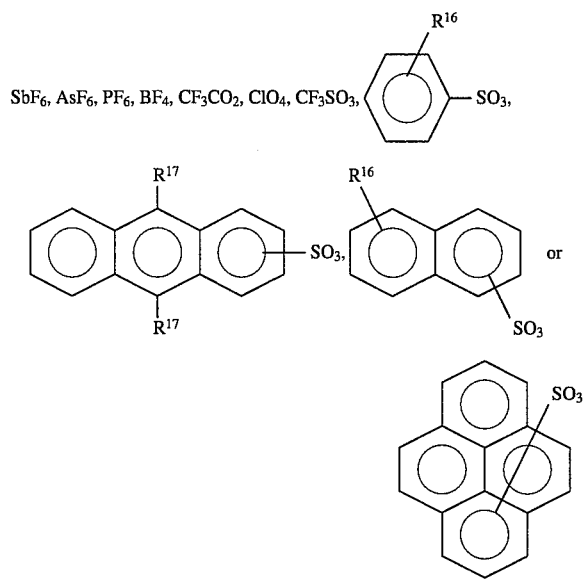

in which $R^{16}$ is a hydrogen atom, an amino group, an anilino group, an alkyl group, preferably an alkyl group having 1–4 carbon atoms or an alkoxy group, preferably an alkoxy group having 1–4 carbon atoms, $R^{17}$ is an alkoxy group, preferably an alkoxy group having 1–4 carbon atoms, and $R^{18}$ is a hydrogen atom, an amino group, an anilino group, an alkyl group, preferably an alkyl group having 1–4 carbon atoms or an alkoxy group, preferably an alkoxy group having 1–4 carbon atoms. Particularly preferable are triphenylsulfonium trifluoromethanesulfonate, diphenyliodonium hexafluoroantimonate, etc. Halogen-containing compounds: Haloalkyl group-containing hydrocarbon compounds, haloalkyl group-containing heterocyclic compounds, etc., preferably, compounds represented by the following formulas:

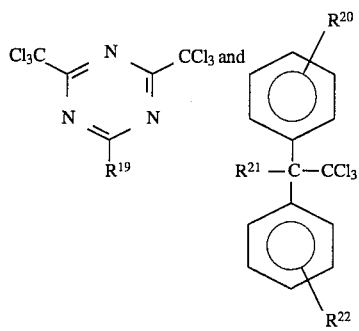

wherein $R^{19}$ represents a trichloromethyl group, a phenyl group, a methoxyphenyl group, a naphthyl group or a methoxynaphthyl group, and $R^{20}$ to $R^{22}$, which may be the same or different, represent hydrogen atoms, halogen atoms, methyl groups, methoxy groups or hydroxyl groups. Particularly preferable are 1,1-bis(4-chlorophenyl)- 2,2,2-trichloroethane, phenyl-bis(trichloromethyl)-s-triazine, naphthyl-bis(trichloromethyl)-s-triazine, etc.

Diazoketone compounds: 1,3-Diketo-2-diazo compounds, diazobenzoquinone compounds, diazonaphthoquinone compounds, etc., preferably, compounds represented by the following formulas:

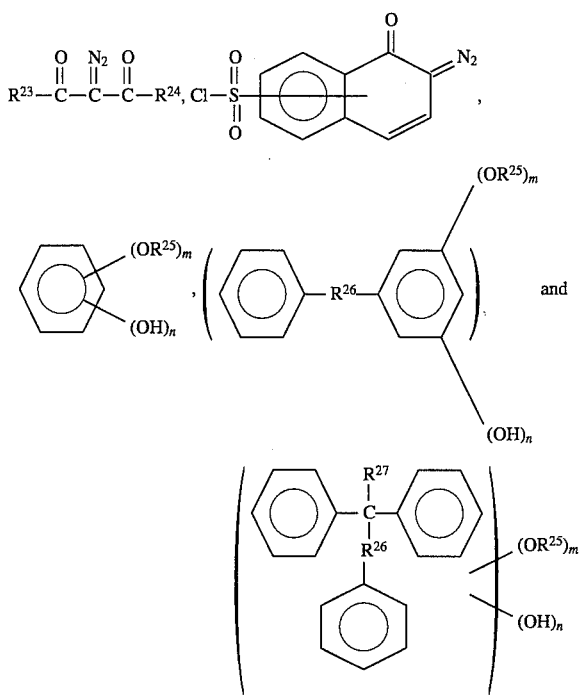

wherein $R^{23}$ and $R^{24}$, which may be the same or different, represent alkyl groups, preferably alkyl groups having 1–4 carbon atoms or substituted or unsubstituted aryl groups, preferably those having 6–20 carbon atoms; $R^{25}$ represents

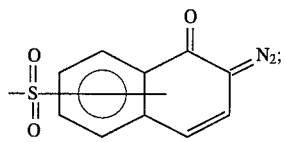

$R^{26}$ represents

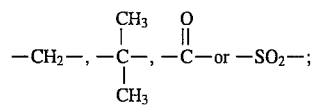

$R^{27}$ represents a hydrogen atom or a methyl group; m represents an integer of 1–6; n represents an integer of 0–5, with a proviso that $1 \leq m+n \leq 6$. Particularly preferable are 1,2-naphthoquinonediazide- 4-sulfonyl chloride, 1,2-naphthoquinonediazide-4-sulfonic acid ester of 2,3,4,4'-tetrahydrobenzophenone, 1,2-naphthoquinone-diazide- 4-sulfonic acid ester of 1,1,1-tris(4-hydroxyphenyl)ethane, 1,2-naphthoquinonediazide-4-sulfonic acid ester of 1,1-bis(3,5-dimethyl-2-hydroxyphenyl)- 1-[4-(4-hydroxybenzyl)phenyl]ethane, etc. Sulfone compounds: β-Ketosulfones, β-sulfonylsulfones, etc., preferably, compounds represented by the following formula:

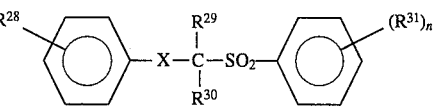

wherein X is

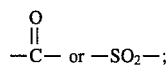

$R^{28}$ to $R^{31}$, which may be the same or different, represent alkyl groups, preferably alkyl groups having 1–4 carbon atoms or halogen atoms; and n is an integer of 0–3. Particularly preferable are 4-trisphenacylsulfone, mesitylphenacylsulfone, bis(phenylsulfonyl)methane, etc.

Nitrobenzyl compounds: Nitrobenzylsulfonate compounds, dinitrobenzylsulfonate compounds, etc., preferably, compounds represented by the following formula:

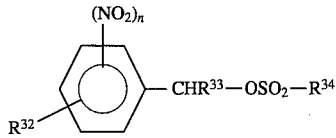

wherein $R^{32}$ represents an alkyl group, preferably an alkyl group having 1–4 carbon atoms; n represents an integer of 1–3; $R^{33}$ represents a hydrogen atom or a methyl group; and $R^{34}$ represents

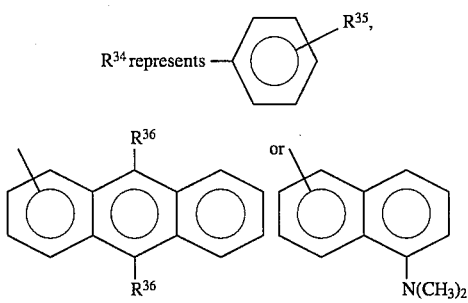

in which $R^{35}$ is a hydrogen atom or an alkyl group, preferably an alkyl group having 1–4 carbon atoms, and $R^{36}$ is an alkoxy group, preferably an alkoxy group having 1–4 carbon atoms. Particularly preferable are 2-nitrobenzyl tosylate, 2,4-dinitrobenzyl tosylate, 4-nitrobenzyl 9,10-diethoxyanthracene-2-sulfonate, etc. Sulfonic acid compounds: Alkylsulfonic acid esters, haloalkylsulfonic acid esters, arylsulfonic acid esters, iminosulfonates, etc., preferably, compounds represented by the following formulas:

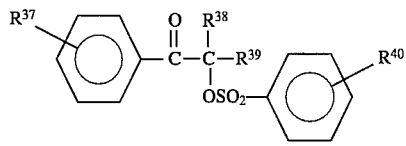

wherein $R^{37}$ and $R^{40}$, which may be the same or different, represent hydrogen atoms or alkyl groups, preferably alkyl groups having 1–4 carbon atoms; and $R^{38}$ and $R^{39}$, which may be the same or different, represent hydrogen atoms, alkyl groups, preferably alkyl groups having 1–4 carbon atoms, aryl groups, preferably aryl groups having 6–20 carbon atoms or aralkyl groups, preferably aralkyl groups having 7–20 carbon atoms;

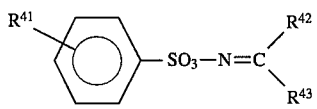

wherein $R^{41}$ represents a hydrogen atom or an alkyl group, preferably an alkyl group having 1–4 carbon atoms; and $R^{42}$ and $R^{43}$, which may be the same or different, represent alkyl groups, preferably alkyl groups having 1–4 carbon atoms or aryl groups, preferably aryl groups having 6–20 carbon atoms, with a proviso that $R^{42}$ and $R^{43}$ may be bonded to each other to form a ring; and

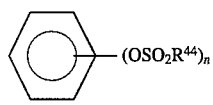

wherein $R^{44}$ represents a methyl group, a trichloromethyl group, a trifluoromethyl group, a phenyl group, a tolyl group, a cyanophenyl group, a trichlorophenyl group, a trifluorophenyl group, a trifluoromethylphenyl group or a pentafluorophenyl group; and n represents an integer of 1–6. Particularly preferable are benzoin tosylate, pyrogallol tris-(trifluoromethanesulfonate), etc.

Of these radiation-sensitive acid-forming agents, onium salts and diazoketone compounds are preferable.

In the present invention, the radiation-sensitive acid-forming agent is used in a proportion of preferably 0.1–20 parts by weight, more preferably 0.5–10 parts by weight, per 100 parts by weight of the polymer (A). The above radiation-sensitive acid-forming agents are used alone or in admixture of two or more.

The composition of the present invention can comprise, if necessary, a compound which can be decomposed by the action of an acid to promote the dissolution of the composition in a developing solution [this compound is referred to hereinafter as component (C)]. The component (C) includes, for example, compounds represented by the following formulas:

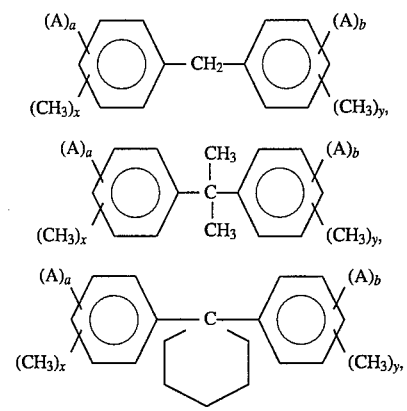

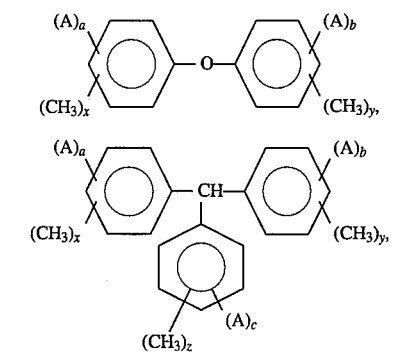

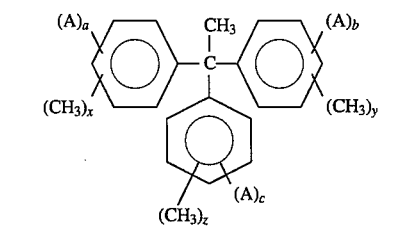

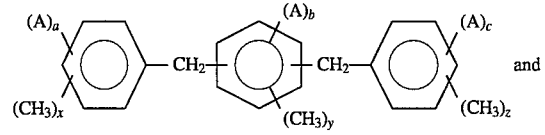

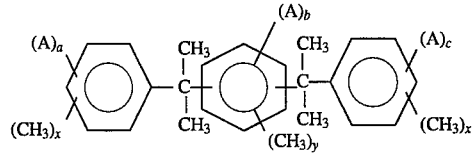

wherein A represents

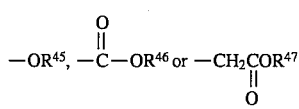

in which $R^{45}$ to $R^{47}$ are substituted methyl groups, substituted ethyl groups, silyl groups, germyl groups or alkoxycarbonyl groups; each of a, b and c represents an integer of 0–3, excluding the case that a, b and c are all 0; and each of x, y and z represents an integer of 0–3.

Examples of the substituted methyl groups, the substituted ethyl groups, the silyl groups, the germyl groups and the alkoxycarbonyl groups in the definitions of $R^{45}$ to $R^{47}$ are the same as the respective examples of the substituted methyl group, the substituted ethyl group, the silyl group, the germyl group and the alkoxycarbonyl group mentioned in the definition of $R^1$.

The amount of the component (C) used is preferably 100 parts by weight or less, more preferably 10–50 parts by weight, per 100 parts by weight of the polymer (A).

The composition of the present invention may further comprise various additives if necessary.

Such additives include, for example, surface active agents for improving the coatability of the composition, inhibiting the striation on the film formed, improving the developability of the radiation-irradiated portion, etc. The surface active agents include nonionic surfactants such as polyoxyethylene lauryl ether, polyoxyethylene stearyl ether, polyoxyethylene oleyl ether, polyoxyethylene octylphenol ether, polyoxyethylene nonylphenol ether, polyethylene glycol dilaurate, polyethylene glycol distearate and the like; fluorine-containing surfactants such as F Top EF 301, EF 303 and EF 352 (products of Shin Akita Kasei K.K.), Megafac F 171 and F 173 (products of DAINIPPON INK & CHEMICALS), Fluorad FC 430 and FC 431 (products of Sumitomo 3M Limited), Asahi Guard AG 710, Surflon S-382, Surflon SC 101, SC 102, SC 103, SC 104, SC 105 and SC 106 (products of Asahi Glass Co., Ltd.) and the like; organosiloxane polymer KP 341 (product of Shin-Etsu Chemical Co., Ltd.); and Polyflow No. 75 and No. 95 (products of Kyoeisha Yushikagaku Kogyo K.K.) which are acrylic or methacrylic acid polymers; and the like.

The amount of the surface active agents used is preferably 2 parts by weight or less per 100 parts by weight of the sum of the polymer (A) and the radiation-sensitive acid-forming agent.

The additives further include a halation-preventing agent consisting of an azo compound, an amine compound or the like; an adhering aid; a storage-stabilizer; a defoaming agent; etc.

The composition of the present invention can be prepared by dissolving in a solvent the necessary amounts of the polymer (A), the radiation-sensitive acid-forming agent and optional components such as the component (C) and various additives. The solvent used in this case includes, for example, ethylene glycol monomethyl ether, ethylene glycol monoethyl ether, ethylene glycol monopropyl ether, ethylene glycol monobutyl ether, diethylene glycol dimethyl ether, diethylene glycol diethyl ether, diethylene glycol dipropyl ether, diethylene glycol dibutyl ether, methyl Cellosolve acetate, ethyl Cellosolve acetate, propylene glycol monomethyl ether acetate, propylene glycol monoethyl ether acetate, propylene glycol monopropyl ether acetate, toluene, xylene, methyl ethyl ketone, cyclohexanone, methyl 2-hydroxypropionate, ethyl 2-hydroxypropionate, ethyl 2-hydroxy-2-methylpropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutyl propionate, 3-methyl-3-methoxybutyl butyrate, ethyl acetate, butyl acetate, methyl acetoacetate, ethyl acetoacetate, methyl 3-methoxypropionate, ethyl 3-ethoxypropionate, N-methylpyrrolidone, N,N-dimethylformamide, N,N-dimethylacetamide and the like.

To the above solvent may be added, if necessary, a high-boiling solvent such as benzyl ethyl ether, dihexyl ether, diethylene glycol monomethyl ether, diethylene glycol monoethyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl Cellosolve acetate or the like.

The composition of the present invention is coated in the form of the above-mentioned solution on a substrate such as silicon wafer or the like and dried to form a resist film. In this case, the coating on a substrate is conducted, for example, by dissolving the present composition in the above-mentioned solvent so that the solid content in the resulting solution becomes 5–50% by weight, filtering the solution, and coating the filtrate by spin-coating, flow-coating, roll-coating or the like.

The resist film formed is partially irradiated with a radiation for forming a fine pattern. The radiation used is not critical; however, for example, ultraviolet rays (e.g. excimer laser), X-rays (e.g. synchrotron radiation), charged particle beams (e.g. electron beam) and the like are used depending upon the kind of the radiation-sensitive acid-forming agent used. Conditions for irradiating with the radiation, such as radiation dose and the like are appropriately determined depending upon the formulation of the composition prepared, the kinds of the additives used, etc.

In the present invention, in order to enhance the apparent sensitivity of the resist film, it is appropriate to heat the resist film after the irradiation. The heating temperature may be varied depending upon the formulation of the composition prepared, the kinds of the additives used, etc., and preferably ranges from 30° to 200° C., more preferably from 50° C. to 150° C.

As a developing solution used in the subsequent development, there may be used, in order to obtain a positive pattern, an aqueous alkaline solution prepared by dissolving in water sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrol, piperidine, 1,8-diazabicyclo[5.4.0]-7-undecene, 1,5-diazabicyclo[4.3.0]-5-nonane or the like.

The above alkaline solution as a developing solution may have added thereto a water-soluble organic solvent, for example, an alcohol such as methanol, ethanol or the like and a surface active agent in appropriate amounts.

Also, chloroform, benzene or the like may be used as a developing solution. In this case, a negative pattern can be obtained.

The radiation-sensitive composition of the present invention can be suitably used as a resist composition which enables reliable fine processing, which has high sensitivity and high resolution degree, and which is superior in dry etching resistance, developability, adhesiveness, heat resistance, yield of residual film thickness, etc. Further, the present radiation-sensitive composition can be effectively used as a resist for the production of integrated circuits which are presumed to become increasingly finer because the composition can respond to various radiations such as far-ultraviolet rays (e.g. excimer laser), X-rays (e.g. synchrotron radiation) and charged particle beams (e.g. electron beam).

The present invention is described below in more detail referring to Examples. However, the present invention is by no means restricted thereto.

SYNTHESIS EXAMPLE 1

In 1,000 g of dioxane was dissolved 200 g of a poly(styrene-maleic anhydride) (styrene:maleic anhydride = 1:1 by mole). To the resulting solution was added 200 g of benzyl alcohol. The solution was heated at 100° C. for 4 hours with stirring, after which the solution was coagulated in hexane to obtain poly(styrene-monobenzyl maleate) [referred to hereinafter as polymer (1)]. By using phenol or benzylamine in place of the benzyl alcohol, there were obtained poly(styrene-monophenyl maleate) [referred to hereinafter as polymer (2)] and poly(styrene-maleic acid benzylamide) [referred to hereinafter as polymer (3)].

In 100 g of tetrahydrofuran was dissolved 30 g of the polymer (1) used as a raw material polymer, and 30 g of 3,4-dihydro-2H-pyran was added as a reaction reagent, after which reaction was conducted. The reaction mixture was coagulated in hexane to obtain a polymer (referred to hereinafter as polymer A).

The same procedure as above was repeated, except that the above raw material polymer and reaction reagent were replaced with those shown in Table 1 (the respective amounts were not changed) to obtain polymers (referred to hereinafter as polymers B to I).

1:1 by mole). The suspension was heated at 80° C. for 6 hours with stirring, and then subjected to coagulation in 20 liters of an aqueous 5% by weight hydrochloric acid solution to obtain a poly(styrenemaleic acid) [referred to hereinafter as polymer (4)]. The same procedure as above was repeated, except the above poly(styrene-maleic anhydride) was replaced with a poly(styrene-maleic anhydride) (styrene:maleic anhydride = 2:1 by mole) or a poly(styrene-maleic anhydride) (styrene:maleic anhydride= 3:1 by mole) to obtain a polymer (styrene:maleic acid= 2:1 by mole) [referred to hereinafter as polymer (5)] and a polymer (styrene:maleic acid= 3:1 by mole) [referred to hereinafter as polymer (6)].

In 100 g of ethyl acetate was dissolved 15 g of the polymer (4) used as a raw material polymer, and 15 g of 3,4-dihydro-2H-pyran was added as a reaction reagent, after which reaction was conducted. The reaction mixture was coagulated in hexane to obtain a polymer (referred to hereinafter as polymer J). The same procedure as above was repeated, except that the above raw material polymer and reaction reagent were replaced with those shown in Table 2 (the respective amounts were not changed) to obtain polymers (referred to hereinafter as polymers K to O).

TABLE 1

| Formed polymer | Raw material polymer | Reaction reagent | Kind of substituent in formula (1) $R^1$ | $R^2$ | Proportion of formula (1) (mole %) | Mw |
|---|---|---|---|---|---|---|
| A | (1) | Dihydropyran | Tetrahydropyranyl | Benzyloxy | 50 | 7,000 |
| B | (1) | Trimethylchlorosilane | Trimethylsilyl | " | " | " |
| C | (1) | Ethyl vinyl ether | 1-Ethoxyethyl | " | " | " |
| D | (2) | Dihydropyran | Tetrahydropyranyl | Phenoxy | " | " |
| E | (2) | Trimethylchlorosilane | Trimethylsilyl | " | " | " |
| F | (2) | Ethyl vinyl ether | 1-Ethoxyethyl | " | " | " |
| G | (3) | Dihydropyran | Tetrahydropyranyl | Benzylamino | " | " |
| H | (3) | Trimethylchlorosilane | Trimethylsilyl | " | " | " |
| I | (3) | Ethyl vinyl ether | 1-Ethoxyethyl | " | " | " |

SYNTHETIC EXAMPLE 2

In 1,000 g of an aqueous solution containing 15% by weight of potassium hydroxide was suspended 200 g of a poly(styrene-maleic anhydride) (styrene:maleic anhydride=

TABLE 2

| Formed polymer | Raw material polymer | Reaction reagent | Kind of substituent in formula (1) $R^1$ | $R^2$ | Proportion of formula (1) (mole %) | Mw |
|---|---|---|---|---|---|---|
| J | (4) | Dihydropyran | Tetrahydropyranyl | Tetrahydropyranyloxy | 50 | 7,000 |

TABLE 2-continued

| Formed polymer | Raw material polymer | Reaction reagent | Kind of substituent in formula (1) R¹ | R² | Proportion of formula (1) (mole %) | Mw |
|---|---|---|---|---|---|---|
| K | (4) | Trimethylchlorosilane | Trimethylsilyl | Trimethylsilyloxy | " | " |
| L | (5) | Dihydropyran | Tetrahydropyranyl | Tetrahydropyranyloxy | 33 | 8,000 |
| M | (5) | Trimethylchlorosilane | Trimethylsilyl | Trimethylsilyloxy | " | " |
| N | (6) | Dihydropyran | Tetrahydropyranyl | Tetrahydropyranyloxy | 25 | 11,000 |
| O | (6) | Trimethylchlorosilane | Trimethylsilyl | Trimethylsilyloxy | " | " |

SYNTHETIC EXAMPLE 3

In 40 g of dioxane were dissolved 20 g of di-tert-butyl fumarate, 12 g of styrene and 1.9 g of azobisisobutyronitrile. The gas phase in the system was purged with nitrogen. Reaction was conducted at 70° C for 6 hours with stirring. The reaction mixture was coagulated in methanol to obtain a polymer (referred to hereinafter as polymer P).

TABLE 3

| Formed polymer | Substituent in formula (1) R¹ | R² | Proportion of formula (1) (mole %) | Mw |
|---|---|---|---|---|
| P | tert-Butyl | tert-Butoxy | 50 | 10,000 |

EXAMPLE 1

In methyl 3-methoxypropionate were dissolved 20 g of the polymer A and 1 g of triphenylsulfonium trifluoromethanesulfonate as a radiation-sensitive acid-forming agent. The solution was filtered through a 0.2 μm filter to obtain a composition solution. The composition solution was spin-coated on a silicon wafer. The coated silicon wafer was heated on a hot plate at 100 ° C. for 2 minutes to form a resist film of 1 μm in thickness on the silicon wafer.

A pattern mask was intimately contacted with the resist film. The resulting assembly was irradiated through the mask with an excimer laser at a dose of 20 mJ/cm² using a KrF excimer laser generator (MBK-400TL-N manufactured by Admon Science Inc.). Then, the mask was separated from the film. The film was heated on a hot plate at 100° C. for 2 minutes, developed with an aqueous solution containing 2.38% by weight of tetramethylammonium hydroxide for 60 seconds, and then rinsed with water for 30 seconds. As a result, a pattern of 0.4 μm was obtained. Good results were also obtained in dry etching resistance, developability, adhesiveness, heat resistance, etc.

EXAMPLES 2–16

Preparation of composition solutions and formation of patterns were conducted in the same manner as in Example 1, except that the polymer A used in Example 1 was replaced with one of the polymers B to P, to obtain patterns of 0.4 μm. Good results were also obtained in dry etching resistance, developability, adhesiveness, heat resistance, etc.

What is claimed is:

1. A radiation sensitive composition comprising: (A) a polymer having a recurring unit represented by formula (1) and at least one recurring unit represented by formula (2):

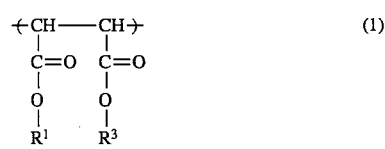

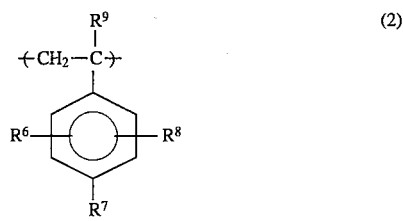

wherein $R^1$ represents a substituted methyl group or a substituted ethyl group; $R^3$ represents an aryl group, an aralkyl group, a substituted methyl group or a substituted ethyl group; $R^6$, $R^7$ and $R^8$ may be the same or different and each represents a hydrogen atom, a halogen atom, a hydroxyl group, an amino group, an alkyl group or an alkoxy group; and $R^9$ represents a hydrogen atom or a methyl group, and (B) at least one radiation-sensitive acid-forming agent selected from the group consisting of an onium salt, a halogen-containing compound, a sulfone compound, a sulfonic acid compound and a nitrobenzyl compound.

2. The radiation-sensitive composition according to claim 1, wherein the substituted methyl group is selected from the group consisting of a methoxymethyl group, a methylthiomethyl group, a methoxyethoxymethyl group, a tetrahydropyranyl group, a tetrahydrothiopyranyl group, a tetrahydrofuranyl group, a tetrahydrothiofuranyl group, a benzyloxymethyl group, a phenacyl group, a bromophenacyl group, a methoxyphenacyl group, an e-methyl-phenacyl group, a cyclopropylmethyl group, a cyclopentyl group, a cyclohexyl group, a benzyl group, a triphenylmethyl group, a diphenylmethyl group, a bromobenzyl group, a nitrobenzyl group, a methoxybenzyl group, a piperonyl group and a furfuryl group.

3. The radiation-sensitive composition according to claim 1, wherein the substituted ethyl group is selected from the group consisting of a 1-methoxyethyl group, a 1-ethoxyethyl group, an isopropyl group, a tert-butyl group and a 1,1-dimethylpropyl group.

4. The radiation-sensitive composition according to claim 1, wherein the aryl group is selected from the group consisting of a phenyl group, a naphthyl group and a tolyl group.

5. The radiation-sensitive composition according to claim 1, wherein the aralkyl group is selected from the group consisting of a benzyl group, an α-methylbenzyl group, a diphenylmethyl group and a trityl group.

6. The radiation-sensitive composition according to claim 1, wherein the polymer (A) has a polystyrene-reduced weight average molecular weight of 1,000 to 50,000.

7. The radiation-sensitive composition according to claim 1, wherein the radiation-sensitive acid-forming agent (B) is an onium salt.

8. The radiation-sensitive composition according to claim 7, wherein the onium salt is selected from the group consisting of iodonium salts, sulfonium salts, phosphonium salts and ammonium salts.

9. The radiation-sensitive composition according to claim 1, wherein the radiation-sensitive acid-forming agent (B) is contained in a proportion of 0.1 to 20 parts by weight per 100 parts by weight of the polymer (A).

10. The radiation-sensitive composition according to claim 1, wherein the polymer (A) is a polymer having a recurring unit represented by formula (1) and at least one of the following units represented by formulas (2) and (2'):

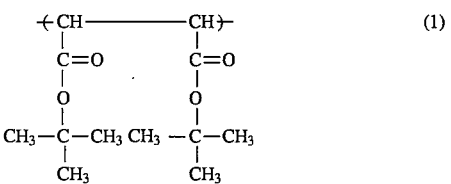

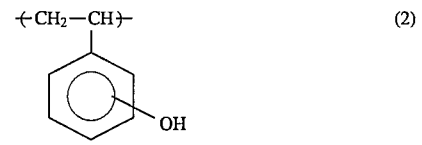

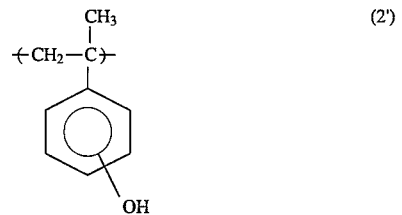

and the radiation-sensitive acid-forming agent (B) is an onium salt or a sulfonic acid compound.

11. The radiation-sensitive composition according to claim 10, wherein the onium salt is selected from the group consisting of iodonium salts, sulfonium salts, phosphonium salts and ammonium salts.

12. The radiation-sensitive composition according to claim 10, wherein the radiation-sensitive acid-forming agent (B) is contained in a proportion of 0.1 to 20 parts by weight per 100 parts by weight of the polymer (A).

* * * * *